US011209514B2

(12) United States Patent
Peev et al.

(10) Patent No.: US 11,209,514 B2
(45) Date of Patent: Dec. 28, 2021

(54) SENSOR SATURATION FAULT DETECTION

(71) Applicant: Melexis Bulgaria Ltd, Sofia (BG)

(72) Inventors: Rumen Marinov Peev, Sofia (BG); Stoyan Georgiev Gaydov, Sofia (BG)

(73) Assignee: MELEXIS BULGARIA LTD, Sofia (BG)

(*) Notice: Subject to any disclaimer, the term of this patent is extended or adjusted under 35 U.S.C. 154(b) by 324 days.

(21) Appl. No.: 16/438,731

(22) Filed: Jun. 12, 2019

(65) Prior Publication Data

US 2019/0377053 A1 Dec. 12, 2019

(30) Foreign Application Priority Data

Jun. 12, 2018 (EP) .................................... 18177381

(51) Int. Cl.
*H03F 3/21* (2006.01)
*G01R 35/00* (2006.01)
*G01R 33/07* (2006.01)

(52) U.S. Cl.
CPC ............. *G01R 35/00* (2013.01); *G01R 33/07* (2013.01)

(58) Field of Classification Search
CPC .... G01R 33/07; G01R 35/00; G01R 31/3842; G01R 19/0092; H03F 3/24; H03F 3/211
See application file for complete search history.

(56) References Cited

U.S. PATENT DOCUMENTS

| 5,553,489 A | 9/1996 | Connell et al. |
| 6,279,248 B1 | 8/2001 | Walters |
| 7,622,367 B1 | 11/2009 | Nuzzo et al. |
| 7,800,389 B2 | 9/2010 | Friedrich et al. |
| 8,447,556 B2 | 5/2013 | Friedrich et al. |
| 8,506,867 B2 | 8/2013 | Menard |
| 8,722,458 B2 | 5/2014 | Rogers et al. |

(Continued)

FOREIGN PATENT DOCUMENTS

| GB | 2227325 A | 7/1990 |
| WO | 2015038564 A1 | 3/2015 |

OTHER PUBLICATIONS

European Search Report from EP Application No. 19179617, dated Oct. 14, 2019.

(Continued)

*Primary Examiner* — Alesa Allgood
(74) *Attorney, Agent, or Firm* — Workman Nydegger (57) ABSTRACT

A method for diagnosing errors in the correct operation of a sensor system. A positive signal amplifier saturation threshold value and a negative signal amplifier saturation threshold value less than the positive signal amplifier saturation threshold value are provided, and at least one signal comparator threshold value. A current value of a first amplified input signal at a first time is provided and a current value of a second amplified input signal obtained at a second time later than the first time, but in the same measurement cycle. The measured values of the first and second amplified input signal are compared to the current signal comparator threshold value. A new output state is determined via the measured first and second amplified input signals. From a previous comparison of the first and second amplified input signal a current output state is provided, from which an expected new output state is determined.

13 Claims, 3 Drawing Sheets

(56) References Cited

U.S. PATENT DOCUMENTS

| | | |
|---|---|---|
| 8,889,485 B2 | 11/2014 | Bower |
| 9,190,997 B2 * | 11/2015 | Shahparnia ........ H03K 17/9622 |
| 9,520,537 B2 | 12/2016 | Bower et al. |
| 9,652,905 B2 | 5/2017 | Peev et al. |
| 9,910,088 B2 | 3/2018 | Milano et al. |
| 2012/0218039 A1* | 8/2012 | Ripley ..................... H03F 3/20 |
| | | 330/129 |
| 2015/0185279 A1* | 7/2015 | Milano .............. G01R 31/2829 |
| | | 324/750.3 |
| 2016/0093600 A1 | 3/2016 | Bower et al. |
| 2016/0252599 A1 | 9/2016 | Motz et al. |
| 2016/0299200 A1 | 10/2016 | Taylor et al. |
| 2018/0067174 A1* | 3/2018 | Prentice ................... H03K 5/08 |

OTHER PUBLICATIONS

COK et al., "AMOLED Displays With Transfer-Printed Integrated Circuits," Journal of the SID, vol. 19, No. 4, 2011, pp. 335-341.
Extended European Search Report from EP Application No. 18177381.3, dated Jan. 4, 2019.

* cited by examiner

SENSOR SATURATION FAULT DETECTION

FIELD OF THE INVENTION

The present invention is generally related to the field of integrated sensor diagnostic structures, circuits and methods.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field or magneto-resistive materials whose electrical resistance changes in response to an external magnetic field.

In many applications it is desirable that sensors are small and are integrated with electronic processing circuitry so as to reduce the overall sensor size and provide improved measurements and integration into external electronic systems. For example, application US2016/299200 describes a Hall-effect magnetic sensor for measuring magnetic fields incorporating an integrated circuit formed in a semiconductor material on a substrate, together with insulation and adhesive layers.

Measurements from sensors can drift over time, providing varying measurements even when exposed to the same field. For example, the field measurements can be offset from a desired nominal value, the sensitivity can vary so that measurements are a multiple (either greater or less than one) of the desired value, or both. Such variation can be the result of changes in environmental conditions, for example temperature or humidity or operational factors, such as vibration or aging. Moreover, devices can fail over time for similar reasons. Furthermore, the materials from which sensors are made can have defects that affect the accuracy, offset bias or symmetry of the magnetic sensor's response.

It is important, therefore, to include diagnostic capabilities to detect faults or failures in complex, safety-critical systems, such as automotive systems, so that repairs can be performed or replacements can be provided for any faulty or failed devices. For example, U.S. Pat. No. 5,553,489 describes a diagnostic system for measuring behaviour of signals provided by a plurality of sensors that includes a plurality of input filters for receiving signals from each of the plurality of sensors and for providing a plurality of filtered sensor signals each derived from the received signals. A signal bandwidth of each of the plurality of filtered sensor signals is lower than the signal bandwidth of the associated received signal. A selection circuit receives each of the signals from each of the plurality of sensors and, dependent on a selection signal, provides a selected sensor signal derived from one of the received signals, wherein the selected sensor signal has a signal bandwidth greater than one of the filtered sensor signals derived from the one of the received signals.

In another example WO2015/038564 describes a method for verifying measurements from a magnetic Hall-effect sensor in a Hall-effect sensor system. In this approach the Hall-effect sensor is excited with an excitation current having a first value. A first measurement corresponding to a voltage output of the Hall-effect sensor when the Hall-effect sensor is excited with the excitation current having the first value is obtained. Additionally, the Hall-effect sensor is excited with the excitation current having a second value, the second value different than the first value. A second measurement corresponding to a voltage output of the Hall-effect sensor when the Hall-effect sensor is excited with the excitation current having the second value is obtained. Operation of the Hall-effect sensor is then verified based at least on the first measurement and the second measurement.

Another approach to managing diagnostics in a magnetic field sensor is described in US2016/252599A1. This design uses switches associated with a magnetic field sensor that provide error information. In particular, a device is provided that includes a magnetic field sensor, a plurality of switches associated with the magnetic field sensor and a control circuit configured to control the plurality of switches and to provide at least one signal indicative of a fault based on operation of the switches.

Yet another design, described in U.S. Pat. No. 9,910,088, provides a method and apparatus for an integrated circuit having a magnetic sensing element and fault detection module coupled to the sensing element, the fault detection module including circuitry to detect a fault condition and to self-test operation of the circuitry for detecting the fault condition. In illustrative embodiments a fault pin indicates the fault condition. U.S. Pat. No. 7,800,389 describes an integrated circuit having a sensor for providing a sensor output signal and a diagnostic circuit coupled to the sensor for providing a self-diagnostic signal. The self-diagnostic signal comprises the sensor output signal during a first time duration and an inverted sensor output signal during a second different time duration.

U.S. Pat. No. 9,652,905 discloses a sensor integrated circuit comprising a controller and a diagnostic module in communication with the controller. The controller is configured for providing a diagnostic reporting signal being a periodic superposition signal on a sensing output of the sensor integrated circuit and/or on a supply current of the sensor integrated circuit. The periodic superposition signal has periodic pulses with a predetermined fixed pulse duration and a predetermined periodicity. The controller furthermore is configured for altering the predetermined periodicity or predetermined fixed pulse duration of the periodic superposition signal upon a fault detection in the diagnostic module communicated to the controller.

U.S. Pat. No. 8,447,556 teaches a magnetic field sensor includes built in self-test circuits that allow a self-test of most of, or all of, the circuitry of the magnetic field sensor, including self-test of a magnetic field sensing element used within the magnetic field sensor, while the magnetic field sensor is functioning in normal operation.

However, these approaches and others similar to them do not necessarily operate the sensor system under critical conditions and can therefore provide a false positive result under such conditions. Moreover, they are subject to faults or defects in the sensor materials leading to incorrect environmental attribute measurements.

There is a need therefore, for circuits and methods in sensor systems that operate and test the sensor systems to detect or correct faults in the sensor under critical test conditions.

SUMMARY OF THE INVENTION

It is an object of embodiments of the present invention to provide for a method and device for use in sensor systems to diagnose errors in the correct operation under critical conditions.

The above objective is accomplished by the solution according to the present invention.

In a first aspect the invention relates to a diagnostic method, comprising:

i) providing at least a signal comparator threshold value, a positive signal amplifier saturation threshold value, a negative signal amplifier saturation threshold value less than said positive signal amplifier saturation threshold value, ii) providing a current value of a first amplified input signal at a first time and a current value of a second amplified input signal obtained at a second time later than said first time, iii) comparing said current value of said first amplified input signal and said current value of said second amplified input signal to said signal comparator threshold value and providing a new output state based on the comparison, iv) providing a current output state from a previous comparison, and determining an expected new output state based on said current output state, v) if said current output state is equal to a first value of said current output state and said new output state is different from said expected new output state, checking whether said current value of said second amplified input signal exceeds said positive signal amplifier saturation threshold value and/or whether said current value of said first amplified input signal is below said negative signal amplifier saturation threshold value, and if so, providing a diagnostic signal that indicates a fault, or:

if said current output state is equal to a second value of said current output state and said new output state is different from said expected new output state, checking whether said current value of said first amplified input signal exceeds said positive signal amplifier saturation threshold value and/or whether said current value of said second amplified input signal is below said negative signal amplifier saturation threshold value, and if so, providing a diagnostic signal that indicates a fault.

The proposed solution indeed allows for diagnosing errors in the correct operation of a sensor system. A positive signal amplifier saturation threshold value and a negative signal amplifier saturation threshold value less than the positive signal amplifier saturation threshold value are provided, as well as at least one signal comparator threshold value. A current value of a first amplified input signal (i.e. a value of the first amplified input signal in the current measurement cycle) at a first time is provided and a current value of a second amplified input signal obtained at a second time later than the first time, but in the same measurement cycle. The measured values of the first and second amplified input signal are then compared to the current signal comparator threshold value. Based on that comparison a new output state is determined, which is thus obtained via the measured first and second amplified input signal. Further, from a previous comparison of the first and second amplified input signal a current output state is provided, from which an expected new output state is determined. So, this expected new output state is derived from the current output state via earlier obtained values of the first and second amplified input signal. All required information has then been collected to check whether a fault is present or not.

Two distinct cases are to be considered, depending on whether the current output state equals to a first or a second value, which correspond to a threshold crossing in a positive or a negative direction. In case the current output state is equal to the first value and the new output state is different from the expected new output state, it needs to be checked whether the current value of the second amplified input signal exceeds the positive signal amplifier saturation threshold value and/or whether the current value of the first amplified input signal is below the negative signal amplifier saturation threshold value. If that is indeed so, a diagnostic signal is generated that indicates a fault. In the other case, whereby the current output state is equal to the second value and the new output state is different from the expected new output state, it is checked if the current value of the first amplified input signal exceeds the positive signal amplifier saturation threshold value and/or whether the current value of the second amplified input signal is below the negative signal amplifier saturation threshold value. Again, a diagnostic signal is generated that indicates a fault if one of the conditions is met. In this way, any asymmetry defect that causes signal amplifier saturation can be detected. Another benefit of the proposed approach is that it can be performed continuously at any measurement cycle without interruption of the application function and without need for a dedicated diagnostic input signal.

In a preferred embodiment comparing the current value of the first amplified input signal and the current value of the second amplified input signal to the signal comparator threshold value comprises calculating a difference between the current value of the second amplified input signal and the current value of the first amplified input signal.

In an embodiment more than one signal comparator threshold value is provided. The signal comparator threshold value is then preferably a function of the current output state.

In embodiments the previous comparison comprises comparing a previous value of the first amplified signal and of the second amplified signal with the signal comparator threshold value. Optionally, the previous comparison also involves calculating a difference between the previous values of the second and the first amplified input signal.

In one embodiment the previous signal comparator threshold value is set equal to a predefined value at start-up of the method.

In embodiments of the invention in iii) of the method the current value of the first amplified input signal and the current value of the second amplified input signal are also compared to an additional current signal comparator threshold value to provide hysteresis.

In a preferred embodiment the diagnostic method is performed in more than two phases.

Advantageously, the current output state is set to a predetermined value if no previous comparison is available. This may for instance occur at start-up.

In another aspect the invention relates to a device comprising at least one input to receive an input signal, at least a signal comparator threshold value, a positive signal amplifier saturation threshold value, a negative signal amplifier saturation threshold value less than said positive signal amplifier saturation threshold value, a signal amplifier responsive to said input signal and arranged to provide a current value of a first amplified input signal at a first time and a current value of a second amplified input signal obtained at a second time later than said first time, a control circuit responsive to said amplified input signal, said control circuit being arranged to compare said current value of said first amplified input signal and said current value of said second amplified input signal to said signal comparator threshold value and providing a new output state based on the comparison, provide a current output state from a previous comparison, and determining an expected new output state based on said current output state, if said current output state is equal to a first value of said current output state and said new output state is different from said expected new output state, check whether said current value of said second amplified input signal exceeds said positive signal amplifier saturation threshold value and/or whether said current value of said first amplified input signal is below said negative signal amplifier saturation threshold value, and if so, provide a diagnostic signal that indicates a fault, or:

if said current output state is equal to a second value of said current output state and said new output state is different from said expected new output state, check whether said current value of said first amplified input signal exceeds said positive signal amplifier saturation threshold value and/or whether said current value of said second amplified input signal exceeds said negative signal amplifier saturation threshold value, and if so, provide a diagnostic signal that indicates a fault.

In preferred embodiments the device comprises a comparator for performing the comparisons. In other preferred embodiments the device comprises an analog-to-digital converter to perform the comparisons.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention provide devices having improved diagnostic capability using smaller and less expensive circuits that can detect or compensate for faults or fine defects in the sensor material or in other elements of the device, or for improper operation of the device. Such defects can be inherent in the material used to make the device or can be formed over time as a result of use or in response to mechanical or other environmental stresses on the device. Other elements of devices, such as integrated circuit controllers, signal amplifiers or comparators, can also fail or operate improperly outside a defined operating range.

Figure 1:
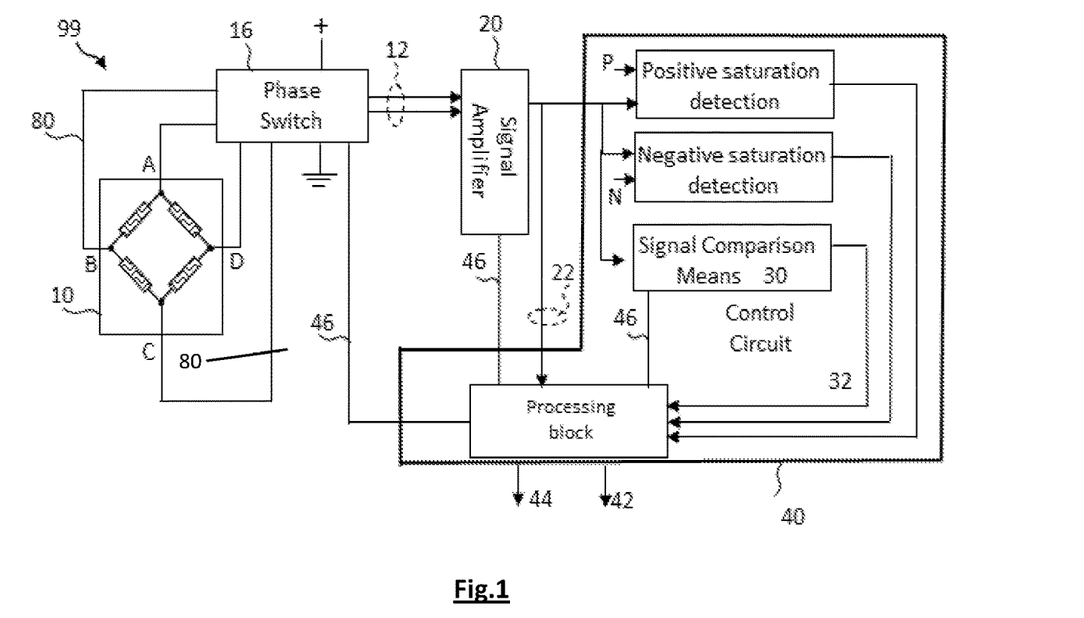
FIG. 1 illustrates an embodiment of a device arranged for performing the diagnostic method according to the present invention.

Referring to FIG. 1, a device 99, for example a sensor device 99, comprises one or more input devices 10, for example sensors for sensing a physical attribute of the environment. The input device 10 provides an input signal 12, for example a sensor signal formed in response to a sensed physical environmental attribute, for example a measurement of a physical quantity of the physical environmental attribute. The sensor signal 12 can be a differential signal, for example a signal defined by the difference in voltage between two signal wires 80. Alternatively, the sensor signal 12 can be a voltage on a single wire with reference to a separate bias signal, such as a ground signal.

The device 99 also comprises a signal amplifier 20 responsive to the input signal 12 that outputs an amplified input signal 22. The signal amplifier 20 can be a differential signal amplifier 20 and the amplified input signal 22 can be a differential signal. The signal amplifier 20 has a predetermined gain value that determines a desired gain or amplification of the input, so that the gain G equals the signal amplifier output divided by the signal amplifier input in a properly functioning system. The gain G can be set by a control signal 46 connected to the signal amplifier 20 from a control circuit 40, for example by a wire and in response to a software or hardware setting in the control circuit 40. The input signal 12 and the amplified input signal 22 can be analog or digital. The input signal 12 and the amplified input signal 22 can be a sensor signal 12 and an amplified sensor signal 22. The input signal 12 and the amplified input signal 22 can be single-ended or differential signals. In various embodiments of the present invention the physical environmental attribute is a magnetic field, an electric field, a pressure field or a gravitational field or a temperature or pressure. The signal amplifier 20 can comprise operational amplifiers (opamps).

The signal amplifier 20 amplifies both positive and negative signals. The signal amplifier reaches a saturation level above a positive signal amplifier saturation threshold P. Similarly, it has a saturation level below a negative signal amplifier saturation threshold N. The negative signal amplifier saturation threshold N is smaller than the positive signal amplifier saturation threshold P. The positive and negative signal amplifier saturation threshold values P, N can be set with a margin for error, for example 95%, 90% or 80% of the physical limitation, i.e. 95%, 90% or 80% of the physical saturation level of the amplifier.

The control circuit of device 99 controls the phase switch 16 and the signal amplifier 20, and is arranged to read the signal from the amplifier and to perform comparisons and saturation detection on the read signals. The signal comparator 30 in the control circuit is arranged to compare signal values obtained at different instances in time. The control circuit 40 includes circuitry, for example analog or digital circuits, including, for example, operational amplifiers or logic circuits. The control circuit 40 can include a memory, for example a digital or an analog memory to store values, such as sensor signals 12 or amplified sensor signals 22. The control circuit 40 can comprise an analog-to-digital convertor to convert analog signals, such as voltages, to corresponding digital signals, amplifiers and comparators.

The control circuit 40 can include a stored computer program or a state machine that provides control to the input device 10. In each measurement cycle the physical environmental attribute is measured at a first time with a sensor 10 to produce and optionally record a first sensor signal 12 (S1) and produce and optionally record a first amplified sensor signal 22 (A1). The control circuit 40 also provides control to the input device 10 at a second time during the measurement cycle different from the first time, to measure the physical environmental attribute with a sensor 10 at that second time different from the first time (for example a later time) to produce and optionally record a second sensor signal 12 (S2) and produce and optionally record a second amplified sensor signal 22 (A2). The control circuit 40 can also comprise circuitry, including for example arithmetic circuits, either digital or analog, such as adders, multipliers, dividers and comparators.

In embodiments of the present invention the device 99 includes a latch-and-switch circuit that outputs a signal indicative of a comparison of the amplified input signals A1 and A2. The circuit can store values of the amplified input signal A1 and A2 and a previous output state.

In embodiments of the invention the sensor(s) is/are inductive sensors. In a preferred embodiment the input device or sensor 10 is a Hall-effect sensor or a magneto-resistive sensor and can be a bridge sensor incorporating multiple input devices or sensors 10 having four circuit connections, A, B, C, D as shown in the embodiment of FIG. 1. In one phase two opposing circuit connections are each connected to a voltage bias signal, for example power and ground, and the other two are selected by the phase switch 16. In another phase the connections are reversed. For example, in the first phase the circuit connections A and C can be electrically connected to first and second voltage bias signals, for example power and ground, respectively, and the circuit connections B and D are selected by the phase switch 16 to provide the differential input or sensor signals S1. In the second phase the circuit connections B and D can be electrically connected to the first and second voltage bias signals, respectively, and the circuit connections A and C are selected by the phase switch 16 to provide the differential input or sensor signals S2. This results in a two-phase spinning method. The phase switch 16 can include electronic switches, relays, mechanical switches or any suitable switching mechanism responsive to a control signal 46 from the control circuit 40 for electrically connecting the first and second voltage bias signals and selecting the sensor signals 12. In a further embodiment of the present invention the device 99 has more than two operational phases and can include multiple input devices or sensors 10.

The control circuit 40 sets for each measurement cycle a signal comparator threshold value T. In some embodiments the threshold value T remains fixed throughout the measurement process. In other embodiments the threshold value T is adapted during the measurement. Even an adaptation from one measurement cycle to a next may be possible. The control circuit processes the difference between the amplified sensor signals in two phases (correlated double sampling approach), preferably consecutive phases, and compares this difference with a predefined signal comparator threshold value T for the current measurement cycle. The signal resulting from the comparison is used by the control circuit to form the sensor (device) output signal.

The signal amplifier 20 amplifies the sensor signals S1, S2 to obtain values of the first amplified sensor signal 22 (A1) and the second amplified sensor signal 22 (A2) for that measurement cycle. The signal comparator 30 compares the current value of the first amplified input signal A1 and the current value of the second amplified input signal A2 to the current signal comparator threshold value T. In a preferred embodiment this is done by comparing the difference A2-A1 to the threshold value T. In another preferred embodiment this is done by comparing the difference A1-A2 to the threshold value T. From the comparator output signal a new output state of the sensor device 99 is derived. The output state can either be a logical 1 or a logical 0. One of the two values corresponds to the difference being greater than the threshold value T and the other one to the difference being smaller than T. One of the logical values corresponds to an 'on' state and the other to an 'off' state. There can be more than one signal comparator threshold value T and each of them can be either positive, negative or zero.

It was already mentioned that a signal comparator threshold T is determined, optionally in each measurement cycle, and stored. For preceding measurement cycles also a comparison of the values of the first and the second amplified input signal was made with the comparator threshold value at that time. From such a comparison an indication of the output state can be derived for the following measurement cycle. Hence, from a comparison performed in the previous measurement cycle the current output state can be obtained and based on that current output state an expected new output state can be determined.

When comparing the actual new output state as determined by measurement of the values of the first and the second amplified input signal in the current measurement cycle with the expected new output state as derived from the current output state which was determined based on the obtained first and the second amplified input signal values in the previous measurement cycle, it may be that the actual trend noticed in the measured values is different from what was expected: where according to the value of the current output state a move in a certain direction, positive or negative, could be expected, the measurements during the current measurement cycle indicate a different behaviour. If the new output state is different from the expected new output state, it means that the threshold was not crossed in the current measurement cycle.

The value of the current output state gives an indication of the difference between the values of the first and the second amplified input signal compared to the signal comparator threshold value T in a previous measurement cycle (the last measurement cycle that was completed or any earlier measurement cycle). It indicates either that A2 was bigger than A1 by at least an amount equal to T, and thus that the signal comparator threshold value is crossed in a positive direction, i.e. that the amplified input signal values are increasing over time, or that, vice versa, A1 was bigger than A2 by an amount T and that the signal comparator threshold value is crossed in a negative direction, i.e. that the amplified input signal values are decreasing over time. Remember that the A2 value is measured at a later time than the A1 value. It may occur, for example at start-up, that A1 and A2 are both equal to zero.

If the new output state is found to be different from the expected new output state, it means that the threshold was not crossed in the measurement cycle and two scenarios can be distinguished, depending on the value of the current output state, i.e. depending on the signal comparator threshold value expected to be crossed in positive or negative direction. In case of an expected positive crossing, the control circuit then checks whether the current value of the second amplified input signal A2 exceeds the positive signal amplifier saturation threshold value P and/or whether the current value of the first amplified input signal A1 is below the negative signal amplifier saturation threshold value N. In case of an expected negative crossing, the control circuit checks whether the current value of the first amplified input signal A1 exceeds the positive signal amplifier saturation threshold value P and/or whether the current value of the second amplified input signal A2 is below the negative signal amplifier saturation threshold value N. If a check yields an affirmative result, the control circuit produces a diagnostic signal to indicate a fault.

The positive or negative saturation detection signals together with the signal comparator output signal are processed (as detailed below) in the control circuit to distinguish between amplifier saturation caused for example by increased Hall sensor offset or signal amplifier offset caused by a device defect and leading to diagnostic fail and the normal saturation caused by applied strong external magnetic field (i.e. the normal function).

Thus, the control circuit takes into account the expected signal comparator threshold crossing direction (positive or negative, independent of the polarity of the signal comparator threshold T) which is a function of the current sensor device state, the positive or negative saturation detection signals and the signal comparator output signal. Three main saturation cases can occur depending on the direction of the amplifier saturation compared to the expected threshold crossing direction for the actual (current) magnetic threshold:

saturation in the direction opposite to the expected threshold crossing direction. This does not disturb the normal sensor function and, hence, there is no need to consider this as a diagnostic fail.

saturation in the expected threshold crossing direction when the magnetic threshold is crossed in the current measurement cycle (consisting of two or more spinning phases). Such saturation is not disturbing the normal sensor function as it does not prevent the crossing of the actual magnetic threshold, therefore there is no need to be considered as a diagnostic fail. Such saturation can for example be caused by an applied strong external magnetic field.

saturation in the expected threshold crossing direction when the magnetic threshold is not crossed in the current measurement cycle. If this type of saturation appears in the measurement cycle, it is assumed to be a diagnostic fail because the amplifier saturation can prevent the correct field detection.

The various saturation cases are listed in the following Table 1. The signal comparator is in this example assumed to always process the difference between the amplified sensor signals in two consecutive phases (amplified sensor signal in phase 2 minus amplified sensor signal in phase 1) and is comparing this difference A2−A1 with a predefined positive or negative signal comparator threshold T.

TABLE 1

| No | Value A1 | Value A2 | Expected threshold crossing direction (function of current device state) | Actual threshold not crossed | Actual threshold is crossed |
|---|---|---|---|---|---|
| P1 | no sat | no sat | positive | No Fault | No Fault |
| P2 | Psat | no sat | positive | No Fault | No Fault |

TABLE 1-continued

| No | Value A1 | Value A2 | Expected threshold crossing direction (function of current device state) | Actual threshold not crossed | Actual threshold is crossed |
|----|----------|----------|---|---|---|
| P3 | no sat | Psat | positive | Fault | No Fault |
| P4 | Psat | Psat | positive | Fault | No Fault |
| P5 | Nsat | no sat | positive | Fault | No Fault |
| P6 | no sat | Nsat | positive | No Fault | No Fault |
| P7 | Nsat | Nsat | positive | Fault | No Fault |
| P8 | Psat | Nsat | positive | No Fault | No Fault |
| P9 | Nsat | Psat | positive | Fault | No Fault |
| N1 | no sat | no sat | negative | No Fault | No Fault |
| N2 | Psat | no sat | negative | Fault | No Fault |
| N3 | no sat | Psat | negative | No Fault | No Fault |
| N4 | Psat | Psat | negative | Fault | No Fault |
| N5 | Nsat | no sat | negative | No Fault | No Fault |
| N6 | no sat | Nsat | negative | Fault | No Fault |
| N7 | Nsat | Nsat | negative | Fault | No Fault |
| N8 | Psat | Nsat | negative | Fault | No Fault |
| N9 | Nsat | Psat | negative | No Fault | No Fault |

The concepts as described above are now illustrated by means of some examples taken from the above table.

Figure 2:
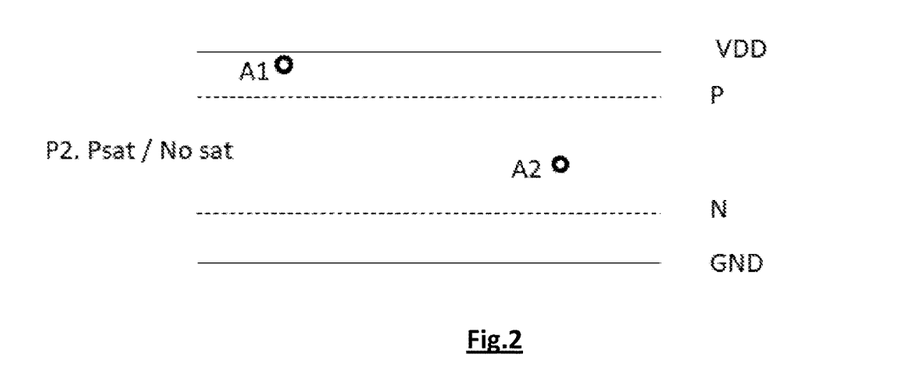
FIG. 2 illustrates an example of a use case of the proposed diagnostic method.

Consider scenario P2 in Table 1, where A1 is found to be in the positive saturation region, the value of A2 is in the normal operating range (see FIG. 2) and the expected crossing is in the positive direction. If the threshold is crossed in the current measurement cycle, it can be assumed that the device is working properly and one can conclude that there is no fault (last column of Table 1). However, if the new output state is different from the expected new output state (in other words, the threshold is not crossed), it is necessary to perform a check in order to verify whether the amplifier saturation in A1 and/or A2 is preventing the threshold to be crossed. In scenario P2, even though the current A1 value is found to be in saturation (A1 is greater than the positive signal amplifier saturation threshold value P), saturation occurs in the direction opposite to the expected crossing direction and it does not prevent the threshold to be crossed in the expected direction (in this case positive). Consequently, one can conclude there is in this case no fault.

Figure 3:
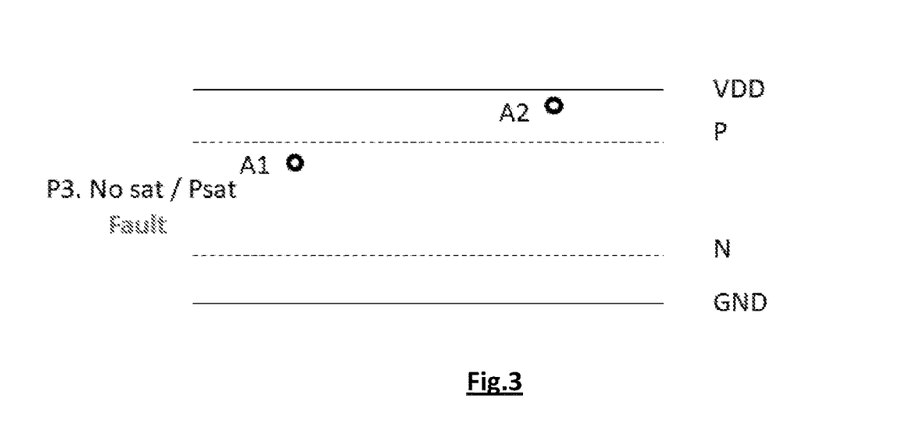
FIG. 3 illustrates an example of a use case of the proposed diagnostic method.

In scenario P3 the value A1 is in the normal operating range of the amplifier (no saturation) while the value A2 is found to be in saturation (A2 is higher than P). See FIG. 3. If the threshold is crossed after comparing A2 and A1 one can assume that the device is working properly and no fault needs to be reported. However, if the new output state is different from the expected new output state (i.e. threshold T is not crossed), a diagnostic signal indicating a fault is generated because saturation occurs in the expected crossing direction and the threshold is not crossed in the positive direction (A2−A1 is not greater than T, probably due to A2 saturation).

Figure 4:
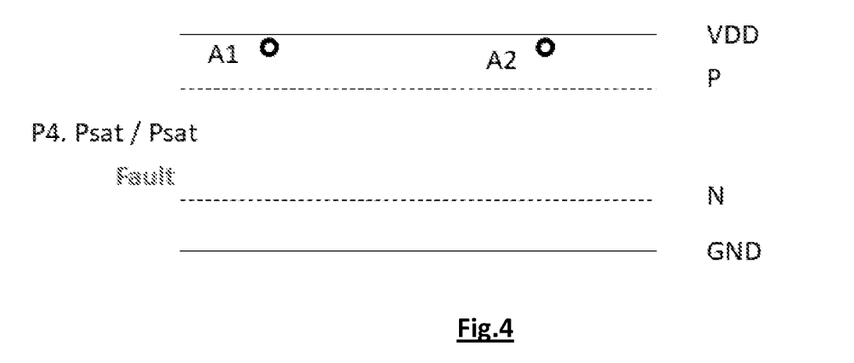
FIG. 4 illustrates an example of a use case of the proposed diagnostic method.

In scenario P4, both values A1 and A2 are found to be higher than the amplifier saturation threshold P (FIG. 4). If the threshold would have been crossed after comparing A2 and A1 one could assume that the device is working properly and no fault needs to be reported. However, as the new output state is different from the expected new output state (i.e. threshold T is not crossed as in FIG. 4), a diagnostic signal indicating a fault is generated because saturation occurs in the expected crossing direction and the threshold was not crossed in the positive direction (A2−A1 is not found greater than T, probably due to A2 saturation). The situation is very similar in scenario P7, where both values are found to be in negative saturation (A1 and A2 are lower than N). If the threshold would have been crossed after comparing A2 and A1 one could have assumed that the device is working properly and no fault needs to be reported. However, as the new output state is different from the expected new output state (i.e. threshold T is not crossed), a diagnostic signal indicating a fault is generated because saturation occurs in the expected crossing direction and the threshold was not crossed in the positive direction (A2−A1 was not greater than T, probably due to A1 saturation).

Figure 5:
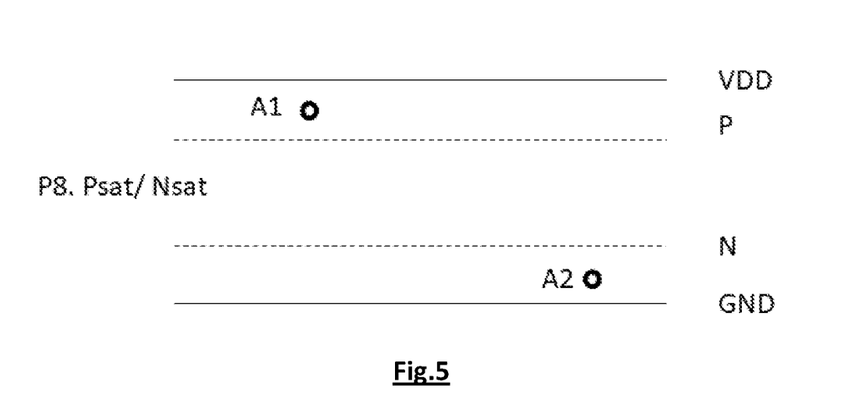
FIG. 5 illustrates an example of a use case of the proposed diagnostic method.

In case P8, even though A1 is in positive saturation (A1>P) and A2 is in negative saturation (A2<N) as illustrated in FIG. 5, no fault is reported as the amplifier saturation is not interfering with normal operation of the circuit (the amplifier saturation in both A1 and A2 occurs in the direction opposite to the expected threshold crossing direction). However, when referring to case P9, A1 is in negative saturation and A2 in positive saturation (the amplifier saturation in both A1 and A2 occurs in the expected threshold crossing direction). If the threshold were crossed after comparing A2 and A1 one could assume that the device is working properly and no fault needs to be reported. However, as in FIG. 5 the new output state is different from the expected new output state (i.e. threshold T is not crossed), a diagnostic signal indicating a fault is generated because saturation occurs in the expected crossing direction and the threshold was not crossed in the positive direction (A2−A1 was not greater than T probably due to A1 saturation and/or A2 saturation).

A same reasoning can be developed for the scenarios N1 to N9 in Table 1 relating to a negative crossing direction.

The device 99 can be operated in various methods of the present invention, for example for both positive and negative-going threshold transitions. In some diagnostic methods, referring to FIG. 6, a device 99 is provided in step 100, together with the signal comparator threshold value(s) T and the positive and negative signal amplifier saturation threshold values P and N. The provided device 99 can comprise one or more input devices 10, for example sensors 10 responsive to an external physical environmental attribute to produce sensor signals 12 (which can be input signals). From a comparison in a previous measurement cycle a current output state is provided in step 105 and a new expected output state is determined. In the current measurement cycle, at a first time (step 110) a first signal amplified sensor signal 22 responsive to a sensor signal 12 is measured and recorded by the control circuit 40 as the first amplified sensor signal A1. Alternatively and as shown in step 112, the current output state can be set equal to a predetermined value as a step in an initialization process when the device is first put into operation. In step 120 the control circuit 40 controls the input device 10 to measure and record at a second time different from the first time, for example the sensor 10 measures the physical environmental attribute with the sensor 10 operating to produce a second sensor signal 12 and a second amplified sensor signal 22 which is recorded by the control circuit 40 as the second amplified sensor signal A2.

Figure 6:
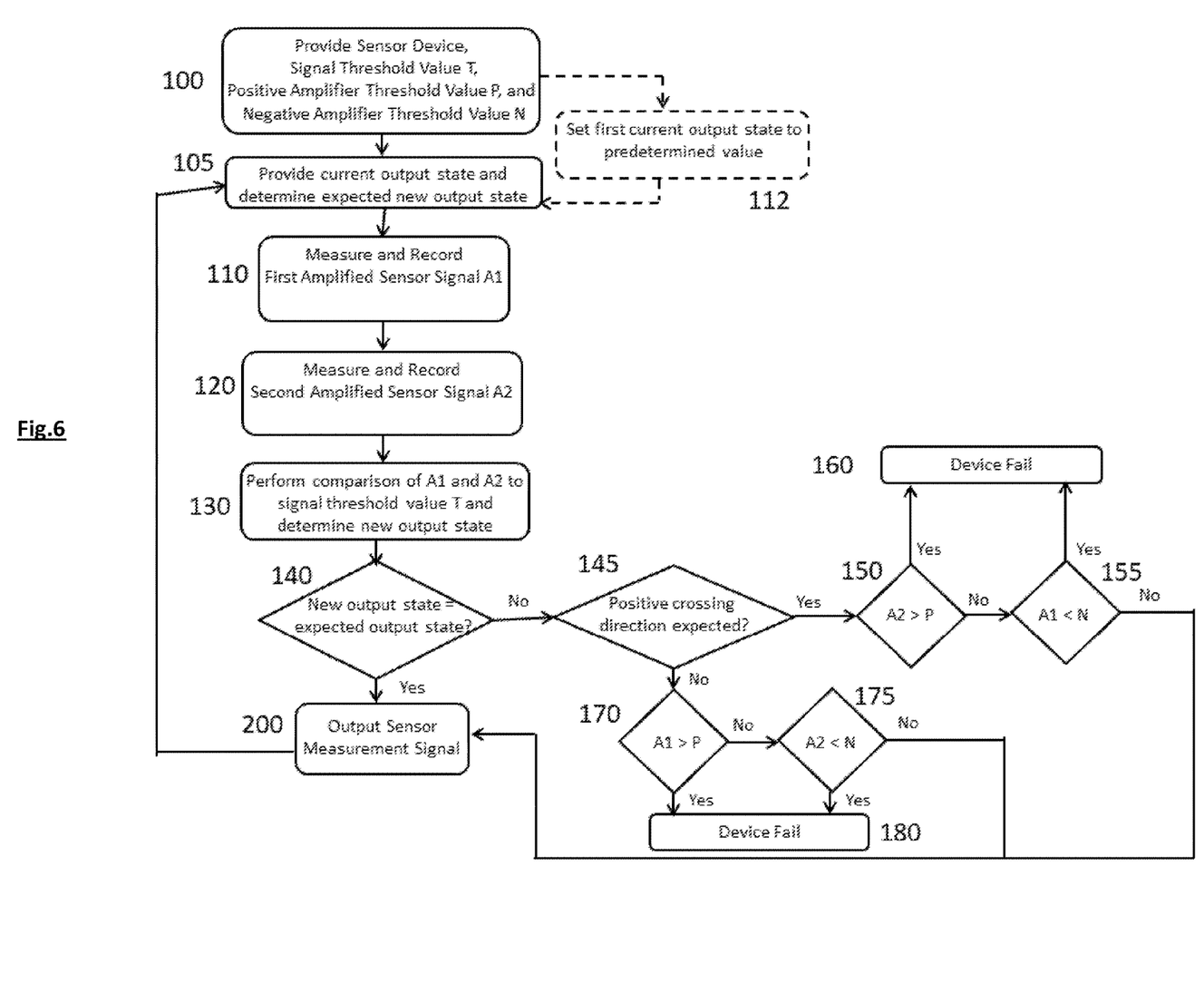
FIG. 6 illustrates a flow chart of an embodiment of the proposed diagnostic method.

Once the measurement and operating values A1, A2 are taken and recorded, in step 130 the control circuit 40 is used to compare A1 and A2 to the signal comparator threshold value T, for example by calculating the difference A2−A1 (or the difference A1−A2). Based on the comparison result a new output state is determined. In a case incorporating hysteresis, the difference is compared to $T_{on}$ and $T_{off}$ thresholds, respectively. If in step 140 the new output state is equal to the expected new output state, there is no fault and an output signal is generated accordingly in step 200. If, on the contrary, there is a mismatch between the calculated new output state and the expected new output state, then in step 145 is checked whether a positive crossing direction is expected. Depending on the outcome a number of checks are performed to detect a possible fault. More concretely, in case of a positive crossing it is verified if the current value of A2 exceeds the positive signal amplifier saturation threshold value P (step 150) and/or if the current value of A1 is below the negative signal amplifier saturation threshold value N (step 155). As soon as one of those conditions is met, a diagnostic signal indicating a device fail can be generated (step 160). If no error is detected, an output signal can be generated in step 200. Similarly, in case there is no positive crossing direction expected in step 145 (hence, there is a negative crossing direction expected), a check is performed to see if the current value A1 exceeds P (step 170) and/or the current value of A2 is below N (step 175). Again, as soon as one of those conditions is met, a diagnostic signal indicating a device fail can be generated (step 180). If no error is detected, an output signal can be generated in step 200.

As will be appreciated by those knowledgeable in the art, some of the steps illustrated in FIG. 6 can be performed in a different order. For example, the determination of the expected new output state based on the current output state can be performed after determining the values of A1 and A2 and the comparison with signal comparator threshold value T. Obviously also the comparison of A1 and A2 with the respective saturation thresholds can be performed in either order.

When the diagnostic process completes with no diagnostic fault (step 200), any combination of the sensor signals 12 or amplified sensor signals 22 can effectively represent a physical quantity of the measured physical attribute of the environment and the comparator 30 provides a valid comparison signal 32 to the control circuit 40. From one or more of the comparison signals 32, for example taken at particular times and combined, the control circuit 40 can produce a measurement signal 44 representing the sensed physical attribute of the environment. In one embodiment the amplified sensor signals A1 and A2 from the first and second time measurements are combined to provide an averaged measurement signal 44. The combined measurements can be a more accurate representation of the physical environmental attribute than any single physical environmental attribute measurement alone.

The input device 10 or sensor 10 are preferably sensors such as Hall-effect sensors or magneto-resistive sensors and can be provided, for example, in an integrated circuit, discrete elements or as separate integrated circuit components (such as bare die) mounted on a sensor device substrate, such as a glass, ceramic, polymer or semiconductor substrate. One or more of the integrated circuit components or elements of the device 99 such as the signal amplifier, comparator or control circuit 20, 30, 40, can be disposed on the sensor substrate as bare die deposited by micro-transfer printing or, in the case of a semiconductor substrate, partially or entirely formed in or on the semiconductor substrate and electrically connected using wires 80 formed using photolithographic materials and methods. The input device or sensor 10, the signal amplifier 20, the control circuit 40 or the differential comparator 30 can include electronic circuits, digital logic circuits, analog circuits or mixed-signal circuits, or a combination of circuit types and electronic devices. Portions or all of the input device or sensor 10, the signal amplifier 20, the control circuit 40 or the differential comparator 30 can be provided in one or more common circuits or packages.

The control circuit 40 can include digital logic circuits, analog circuits or mixed-signal circuits, or a combination of circuit types and electronic devices. In some embodiments the control circuit 40 includes a state machine or a central processing unit (e.g., a stored program machine with a program stored in a memory). The control circuit 40 can include a memory, drivers, digital logic circuits and analog circuits. In some embodiments the control circuit 40 includes environmental sensors and the control circuit 40 provides measurement signals 44 in response to the sensed environment, for example the ambient temperature, humidity, vibration or other physical environmental attributes. Moreover, in some embodiments the control circuit 40 can adapt the measurement signal 44 or the diagnostic signal 42 in response to the environmental conditions using a predetermined calibration of the input device or sensor 10 under those environmental conditions. In other embodiments the control circuit 40 can store a history of use and conditions for the device 99 and adapt the measurement or diagnostic signals 44, 42 in response to the history of use and conditions. For example, components can degrade predictably over time under known environmental conditions or a known pattern of use and the measurement signal 44 or the diagnostic signal 42 adjusted in response to the use or environmental condition history.

In embodiments of the present invention the amount of circuitry required to provide both diagnostic and sensing is reduced by largely using the same circuits for both functions.

The various components of the device 99 can be, for example, provided in electronic circuits, integrated circuits or discrete electronic devices that are electrically connected with wires 80. Any one or all of the various components can be disposed on a printed circuit board or on a semiconductor substrate, or any one or all of the various components can be integrated as a circuit in or on the semiconductor substrate, or some combination of integrated circuits provided on the semiconductor substrate and circuits formed in or the semiconductor substrate. Any one or all of the various components can be provided in packaged integrated circuits or in bare die that are micro-transfer printed onto the semiconductor substrate or other substrate. Wires 80 can be provided using photolithographic methods and materials to connect the various components, integrated circuit dies or circuits integrated on the semiconductor substrate.

Embodiments of the present invention can be constructed by providing a substrate and mounting the input device or sensor 10 on the substrate. In some embodiments the input device or sensor 10, the signal amplifier 20, the comparator 30 and the control circuit 40 are provided in one or more integrated circuits, either packaged or as bare die, and disposed on the substrate surface, for example by microtransfer printing them from corresponding source wafers onto the substrate surface. Alternatively, the substrate surface can be or include a semiconductor layer and one or more, all of, or any portion of each of the input device or sensor 10, the signal amplifier 20, the comparator 30 and the control circuit 40 are formed in the semiconductor layer and electrically connected with any integrated circuit disposed on the substrate surface using wires 80 on the substrate surface, for example using photolithographic or printed circuit board methods and materials.

The substrate can be one of many substrates with a surface capable of supporting or receiving the input device or sensor 10 and integrated circuits, for example a glass, plastic, ceramic, or semiconductor substrate with two opposing relatively planar and parallel sides. The substrate can have a variety of thicknesses, for example from 10 microns to several millimetre. The substrate can be a portion or surface of another device and can include electronic circuitry. The input device or sensor 10 can be provided in a packaged or unpackaged integrated circuit or in a circuit formed or disposed on, in or in direct contact with the substrate, a surface of the substrate or a layer on the substrate.

If the input device or sensor 10 or one or more or any portion of each of the input devices or sensors 10, the signal amplifier 20, the control circuit 40 with the signal comparator 30 are micro-transfer printed to the substrate or layers on the substrate (e.g., dielectric layers) they can be electrically connected to each other with wires 80 as desired through vias in any intervening layers (such as the dielectric layer) as is commonly done in the integrated circuit and printed circuit board arts. Alternatively, the input device or sensor 10 or any integrated circuits are surface mount devices and disposed using surface mount techniques. Micro-transfer printed devices can have broken or separated tethers as a consequence of micro-transfer printing from a source wafer to a destination substrate.

Embodiments of the device 99 of the present invention can be operated by providing electrical power to the input device or sensor 10, the signal amplifier 20, the comparator 30 and the control circuit 40. Responsive to the electrical power, the control circuit 40 operates the other elements of the device 99 as described above.

Therefore, as described above, embodiments of the present invention include a diagnostic method, comprising:
i) providing at least a signal comparator threshold value (T), a positive signal amplifier saturation threshold value (P), a negative signal amplifier saturation threshold value (N) less than said positive signal amplifier saturation threshold value (P),
ii) providing a current value of a first amplified input signal (A1) at a first time and a current value of a second amplified input signal (A2) obtained at a second time later than said first time,
iii) comparing said current value of said first amplified input signal (A1) and said current value of said second amplified input signal (A2) to said signal comparator threshold value (T) and providing a new output state based on the comparison,
iv) providing a current output state from a previous comparison, and determining an expected new output state based on said current output state,
v) if said current output state is equal to a first value and said new output state is different from said expected new output state, checking whether said current value of said second amplified input signal (A2) exceeds said positive signal amplifier saturation threshold value (P) and/or whether said current value of said first amplified input signal (A1) is below said negative signal amplifier saturation threshold value (N), and if so, providing a diagnostic signal that indicates a fault, or:
  if said current output state is equal to a second value and said new output state is different from said expected new output state, checking whether said current value of said first amplified input signal (A1) exceeds said positive signal amplifier saturation threshold value (P) and/or whether said current value of said second amplified input signal (A2) is below said negative signal amplifier saturation threshold value (N), and if so, providing a diagnostic signal that indicates a fault.

In some embodiments of the present invention the control circuit comprises one or more signal comparators, the control circuit comprises one or more signal amplifier saturation comparators, or the control circuit comprises one or more signal comparators and one or more signal amplifier saturation comparators.

In some embodiments of the present invention the diagnostic method is done in two or more phases resulting in a single output signal. This can for example be achieved by a sensor signal S1 being a combination of two (or more) spinning phases or by having two (or more) sensor signals that each represent a phase. A phase in this context should be construed as a different bias and readout nodes of a bridge sensor. In some embodiments the diagnostic signal in any of the two or more phases is a signal processing fault indicating a control circuit fault.

In some embodiments of the present invention the one or more signal comparator threshold values T comprise two signal comparator threshold values T to which the first and second amplified signals A1 and A2 are compared to provide hysteresis. The signal comparator threshold values T can be both positive, both negative or one of them positive and the other negative.

In some embodiments of the present invention the diagnostic method comprises, using the control circuit, determining whether the current value of A2 exceeds the positive signal amplifier saturation threshold value P and/or whether the current value of A1 is below the negative signal amplifier saturation threshold value N then providing a diagnostic signal indicating a fault operation, or determining whether the current value of A1 exceeds the positive signal amplifier saturation threshold value P and/or whether the current value of A2 is below the negative signal amplifier saturation threshold value N, then providing a diagnostic signal indicating a fault operation.

In some embodiments of the present invention the diagnostic method comprises providing the first amplified input signal A1 at the first time by setting it equal to a predetermined value, using the control circuit.

In some embodiments of the present invention, using the control circuit, the diagnostic method comprises providing the first amplified input signal A1 by providing a first input signal S1 at the first time and amplifying the first input signal with the signal amplifier to form the first amplified input signal A1.

In some embodiments of the present invention one or more of the input devices is a sensor that senses a physical attribute of the environment. The one or more sensors can be a Hall-effect magnetic sensor that senses a magnetic field, a magneto-resistive magnetic sensor that senses a magnetic field. The one or more sensors is a bridge sensor, or the one or more sensors is an inductive sensor.

In some embodiments of the present invention the control circuit controls the gain of the signal amplifier to determine one or more desired gain values, the positive signal amplifier saturation threshold value P, and the negative signal amplifier saturation threshold value N.

In some embodiments of the present invention any combination of the input signals S1, S2, A1, or A2 are differential signals and/or the control circuit comprises one or more differential amplifiers.

In some embodiments of the present invention the signal comparator threshold value comprises a positive signal comparator threshold value and a negative signal comparator threshold value less than the positive signal comparator threshold value, and, using the control circuit, the amplified input signals A1 and A2 are compared to the positive signal comparator threshold value when the amplified input signals A1 and A2 are expected to cross the positive signal comparator threshold value from a smaller signal value less than the positive signal comparator threshold to a greater signal value greater than the positive signal comparator threshold, or in some embodiments, using the control circuit, the amplified input signals A1 and A2 are compared to the negative signal comparator threshold value when the amplified input signals A1 and A2 are expected to cross the negative signal comparator threshold value from a greater signal value larger than the negative signal comparator threshold to a smaller signal value less than the negative signal comparator threshold. In some embodiments both comparisons are done.

In some embodiments of the present invention any one or more of the input signal, the amplified input signal, the signal comparator threshold values T, the positive signal amplifier saturation threshold value P and the negative signal amplifier saturation threshold value N are analog signals or digital signals and/or are differential signals.

In some embodiments of the present invention, a device comprises:
  at least one input to receive an input signal,
  at least a signal comparator threshold value (T), a positive signal amplifier saturation threshold value (P), a negative signal amplifier saturation threshold value (N) less than said positive signal amplifier saturation threshold value (P),
  a signal amplifier (20) responsive to said input signal and arranged to provide a current value of a first amplified input signal (A1) at a first time and a current value of a second amplified input signal (A2) obtained at a second time later than said first time,
  a control circuit responsive to said amplified input signal, said control circuit being arranged to
    compare said current value of said first amplified input signal (A1) and said current value of said second amplified input signal (A2) to said signal comparator threshold value (T) and providing a new output state based on the comparison,
    provide a current output state from a previous comparison, and determining an expected new output state based on said current output state,
    if said current output state is equal to a first value of said current output state and said new output state is different from said expected new output state, check whether said current value of said second amplified input signal (A2) exceeds said positive signal amplifier saturation threshold value (P) and/or whether said current value of said first amplified input signal (A1) is below said negative signal amplifier saturation threshold value (N), and if so, provide a diagnostic signal that indicates a fault, or:
    if said current output state is equal to a second value of said current output state and said new output state is different from said expected new output state, check whether said current value of said first amplified input signal (A1) exceeds said positive signal amplifier saturation threshold value (P) and/or whether said current value of said second amplified input signal (A2) is below said negative signal amplifier saturation threshold value (N), and if so, provide a diagnostic signal that indicates a fault.

In some embodiments of the present invention the control circuit comprises one or more signal comparators, the control circuit comprises one or more signal amplifier saturation comparators or the control circuit comprises one or more signal comparators and one or more signal amplifier saturation comparators.

In some embodiments of the present invention the control circuit performs the diagnostic method in two or more phases resulting in a single output signal. This can for example be achieved by a sensor signal S1 being a combination of two (or more) spinning phases or by having two (or more) sensor signals that each represent a phase. A phase in this context should be construed as a different bias and readout nodes of a bridge sensor. The diagnostic signal in any of the two or more phases can be a signal processing fault indicating a control circuit fault.

In some embodiments of the present invention the one or more signal comparator threshold values T comprise two signal comparator threshold values T to which the first and second amplified signals A1 and A2 are compared by the control circuit to provide hysteresis.

In some embodiments of the present invention the control circuit determines whether the current value of A2 exceeds the positive signal amplifier saturation threshold value P and/or whether the current value of A1 is below the negative signal amplifier saturation threshold value N then providing a diagnostic signal indicating a fault operation, or determining whether the current value of A1 exceeds the positive signal amplifier saturation threshold value P and/or whether the current value of A2 is below the negative signal amplifier saturation threshold value N, then providing a diagnostic signal indicating a fault operation.

In some embodiments of the present invention the control circuit provides the first amplified input signal A1 by setting it equal to a predetermined value.

In some embodiments of the present invention the control circuit provides the first amplified input signal A1 by providing a first input signal S1 at the first time and amplifying the first input signal with the signal amplifier to form the first amplified input signal A1.

In some embodiments of the present invention one or more of the input devices is a sensor that senses a physical attribute of the environment. One or more of the sensors can be a Hall-effect sensor that senses a magnetic field or a magneto-resistive sensor that senses a magnetic field, one or more of the sensors is a bridge sensor, or the one or more sensors is an inductive sensor.

In some embodiments of the present invention the control circuit is connected to and controls the signal amplifier with a control signal to control the gain of the signal amplifier to determine one or more of the desired gain values, the positive signal amplifier saturation threshold value P, and the negative signal amplifier saturation threshold value N.

In some embodiments of the present invention the input signal S2 and amplified input signals are differential signals and the signal amplifier is a differential amplifier.

In some embodiments of the present invention a signal comparator threshold value T comprises a positive signal comparator threshold value and a negative signal comparator threshold value less than the positive signal comparator threshold value.

In some embodiments of the present invention any one or more of the sensor signal the amplified input signals A1, A2, the signal comparator threshold values T, the positive signal amplifier saturation threshold value P, and the negative signal amplifier saturation threshold value N are analog signals, digital signals, and/or are differential signals and/or the control circuit comprises one or more differential amplifiers.

In some embodiments of the present invention the input device has more than one operational mode or the control circuit performs the diagnostic method in two or more phases resulting in a single output signal.

Methods of forming micro-transfer printable structures are described, for example, in the paper *AMOLED Displays* using Transfer-Printed Integrated Circuits (Journal of the Society for Information Display, 2011, DOI #10.1889/JSID19.4.335, 1071-0922/11/1904-0335, pp. 335-341) and U.S. Pat. No. 8,889,485, referenced above. For a discussion of micro-transfer printing techniques see U.S. Pat. Nos. 8,722,458, 7,622,367 and 8,506,867, the relevant contents of each of which is hereby incorporated by reference. Micro-transfer printing using compound micro-assembly structures and methods can also be used with the present invention, for example, as described in US2016/093600, entitled Compound Micro-Assembly Strategies and Devices, the relevant portions of which are hereby incorporated by reference in their entirety. In an embodiment, the device 99 is a compound micro-assembled device. Additional details useful in understanding and performing aspects of the present invention are described in U.S. Pat. No. 9,520,537, entitled Micro Assembled LED Displays and Lighting Elements.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A diagnostic method, comprising:
    i) providing at least a signal comparator threshold value, a positive signal amplifier saturation threshold value, a negative signal amplifier saturation threshold value less than said positive signal amplifier saturation threshold value,
    ii) providing a current value of a first amplified input signal at a first time and a current value of a second amplified input signal obtained at a second time later than said first time,
    iii) comparing said current value of said first amplified input signal and said current value of said second amplified input signal to said signal comparator threshold value and providing a new output state based on the comparison, wherein said current value of said first amplified input signal and said current value of said second amplified input signal are also compared to an additional signal comparator threshold value to provide hysteresis,
    iv) providing a current output state from a previous comparison, and determining an expected new output state based on said current output state,
    v) if said current output state is equal to a first value and said new output state is different from said expected new output state, checking whether said current value of said second amplified input signal exceeds said positive signal amplifier saturation threshold value and/or whether said current value of said first amplified input signal is below said negative signal amplifier saturation threshold value, and if so, providing a diagnostic signal that indicates a fault, or:
    if said current output state is equal to a second value and said new output state is different from said expected new output state, checking whether said current value of said first amplified input signal exceeds said positive signal amplifier saturation threshold value and/or whether said current value of said second amplified input signal is below said negative signal amplifier saturation threshold value, and if so, providing a diagnostic signal that indicates a fault.

2. The diagnostic method as in claim 1, wherein said comparing said current value of said first amplified input signal and said current value of said second amplified input signal to said signal comparator threshold value comprises calculating a difference between said current value of said second amplified input signal and said current value of said first amplified input signal.

3. The diagnostic method as in claim 1, wherein said previous comparison comprises comparing a previous value of said first amplified signal and a previous value of said second amplified signal with said signal comparator threshold value.

4. The diagnostic method as in claim 1, wherein said signal comparator threshold value is set equal to a predefined value at start-up of the method.

5. The diagnostic method as in claim 1, wherein the diagnostic method is performed in more than two phases.

6. The diagnostic method as in claim 1, wherein said current output state is set to a predetermined value if said previous comparison is not available.

7. The diagnostic method as in claim 1, wherein more than one signal comparator threshold value is provided.

8. The diagnostic method as in claim 7, wherein said signal comparator threshold value is a function of said current output state.

9. A device comprising
    at least one input to receive an input signal,
    at least a current and a previous signal comparator threshold value, a positive signal amplifier saturation threshold value, a negative signal amplifier saturation threshold value less than said positive signal amplifier saturation threshold value,
    a signal amplifier responsive to said input signal and arranged to provide a current value of a first amplified input signal at a first time and a current value of a second amplified input signal obtained at a second time later than said first time,
    a control circuit responsive to said amplified input signals, said control circuit being arranged to
    compare said current value of said first amplified input signal and said current value of said second amplified input signal to said current signal comparator threshold value and providing a new output state based on the comparison, wherein said current value of said first amplified input signal and said current value of said second amplified input signal are also compared to an additional signal comparator threshold value to provide hysteresis, provide a current output state from a previous comparison, and determining an expected new output state based on said current output state, if said current output state is equal to a first value of said current output state and said new output state is different from said expected new output state, check whether said current value of said second amplified input signal exceeds said positive signal amplifier saturation threshold value and/or whether said current value of said first amplified input signal is below said negative signal amplifier saturation threshold value, and if so, provide a diagnostic signal that indicates a fault, or:

if said current output state is equal to a second value of said current output state and said new output state is different from said expected new output state, check whether said current value of said first amplified input signal exceeds said positive signal amplifier saturation threshold value and/or whether said current value of said second amplified input signal is below said negative signal amplifier saturation threshold value, and if so, provide a diagnostic signal that indicates a fault.

10. The device as in claim 9, comprising a comparator for performing the comparisons.

11. The device as in claim 9, wherein said control circuit comprises an analog-to-digital converter to perform the comparisons.

12. The device as in claim 9, wherein said input signal is a magnetic sensor signal.

13. The device as in claim 9, wherein said input signal is a Hall sensor signal.

* * * * *